United States Patent [19]
Chiou

[11] Patent Number: 5,769,941
[45] Date of Patent: Jun. 23, 1998

[54] METHOD OF FORMING SEMICONDUCTOR MATERIAL

[75] Inventor: Herng-Der Chiou, Tempe, Ariz.

[73] Assignee: Motorola, Inc., Schaumburg, Ill.

[21] Appl. No.: 641,398

[22] Filed: May 1, 1996

[51] Int. Cl.[6] .................................................. C30B 28/02
[52] U.S. Cl. .................................... 117/2; 117/3; 117/902
[58] Field of Search ..................................... 117/2, 3, 902

[56] References Cited

U.S. PATENT DOCUMENTS

| | | | |
|---|---|---|---|
| 2,858,730 | 11/1958 | Hanson | 117/902 |
| 4,096,025 | 6/1978 | Caslovsky et al. | 117/902 |
| 4,908,094 | 3/1990 | Hosoi et al. | 117/902 |

FOREIGN PATENT DOCUMENTS

| | | | |
|---|---|---|---|
| 405347256A | 12/1993 | Japan | 117/902 |

*Primary Examiner*—Felisa Garrett
*Attorney, Agent, or Firm*—Robert F. Hightower

[57] ABSTRACT

A seed (22) is formed to have a [110] direction (24) that is at an angle (26) to the pull direction (23) used for growing a semiconductor ingot (36). Dislocations (34) in the ingot (36) terminate on the surface of the neck (37) of the ingot, and do not propagate into the body (38) of the ingot (36).

15 Claims, 3 Drawing Sheets

METHOD OF FORMING SEMICONDUCTOR MATERIAL

BACKGROUND OF THE INVENTION

The present invention relates, in general, to semiconductor materials, and more particularly, to a novel method of forming semiconductor materials.

In the manufacturing of semiconductor devices, it is often desirable to utilize wafers having a crystal lattice structure oriented in the [110] direction, that is, so that the [110] direction is normal to the surface of the wafer. It is well known in the semiconductor industry that such [110] oriented material has a high number of dislocations. Semiconductor devices formed on such [110] oriented wafers typically have a high number of defects which results in high manufacturing costs.

One method directed at reducing the dislocations in [110] oriented wafers is disclosed in U.S. Pat. No. 4,002,453 issued to Dyer on Jan. 11, 1977. This method utilizes different growth rates while growing or forming portions of [110] oriented ingots of semiconductor material. By constantly repeating a sequence of a fast growth rate followed by a slow growth rate, the neck portions of the ingots have varying diameters. The varying diameters reduce the dislocations in the body section of the ingot. However, varying the growth rates in such a manner is difficult to achieve, and it is expensive to modify growth equipment to obtain such a pattern of constantly alternating growth rates.

Accordingly, it is desirable to have a method of forming semiconductor material that results in substantially dislocation free semiconductor material that has a [110] oriented crystal lattice structure, that does not require modifying existing equipment, and that results in low cost wafers.

DETAILED DESCRIPTION OF THE DRAWINGS

Figure 1:
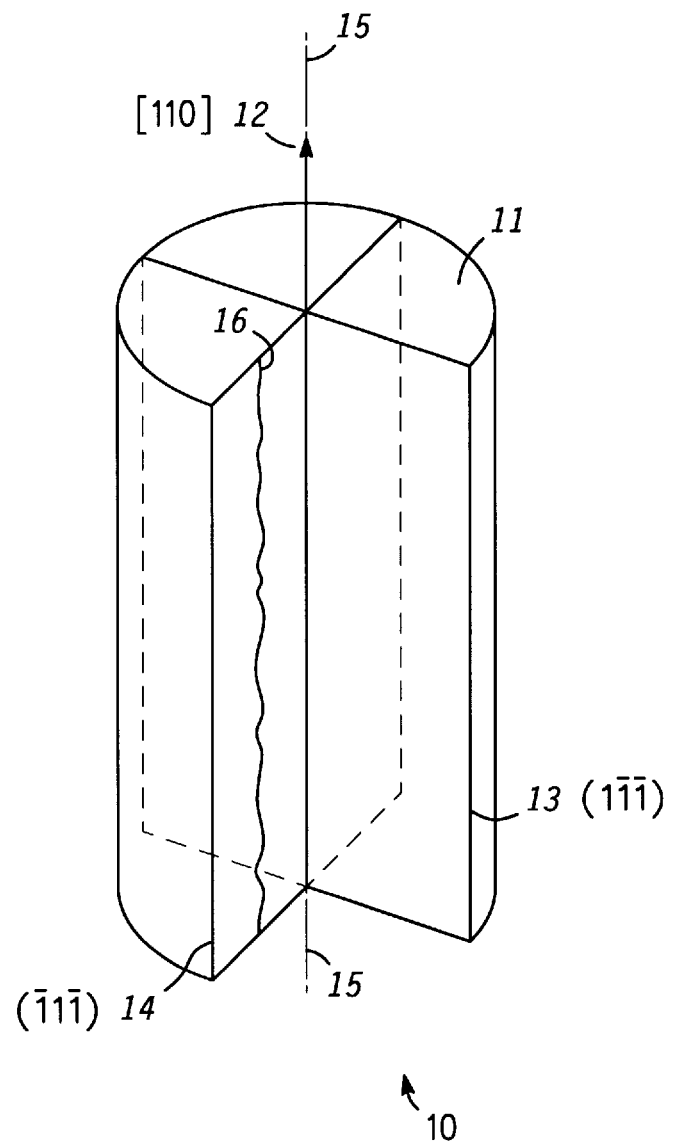
FIG. 1 schematically illustrates a portion of a [110] oriented semiconductor ingot.

FIG. 1 schematically illustrates a portion of a silicon ingot 10 and crystal lattice planes within ingot 10. FIG. 1 is used to illustrates the problems associated with forming semiconductor material with a [110] direction. Ingot 10 is shown in cut-away to illustrate some of the crystal lattice planes. One skilled in the art will notice that such a view is for illustration purposes only and that the planes are not actually viewable by simply cutting-away a portion of ingot 10. As illustrated in FIG. 1, ingot 10 is sawed in half to expose a surface 11. Ingot 10 has a crystalline lattice structure that has been formed so that a [110] direction 12 is substantially normal to surface 11. Ingot 10 has a major axis 15 that extends along the length of ingot 10. Often, axis 15 is called the pull direction or pulling axis because it is the direction used to pull ingot 10 from a melt of the material used for forming ingot 10.

Because of the [110] orientation of the crystalline lattice structure, ingot 10 has a ($1\bar{1}\bar{1}$) plane 13 and a ($\bar{1}1\bar{1}$) plane 14 that both are parallel to direction 12. As shown in FIG. 1, a dislocation 16 represents a dislocation formed within plane 14. Once dislocation 16 forms, it propagates through plane 14 to extend the entire length of ingot 10. Consequently, any wafer sawed or formed from ingot 10 will contain a portion of dislocation 16. As can be seen from FIG. 1, any dislocation that forms in plane 13 would also propagate the length of ingot 10 and result in dislocations in wafers formed from ingot 10. Such dislocations form when ingot 10 is formed by well known crystal growth methods such as the Float Zone or Czochralski methods.

Figure 2:
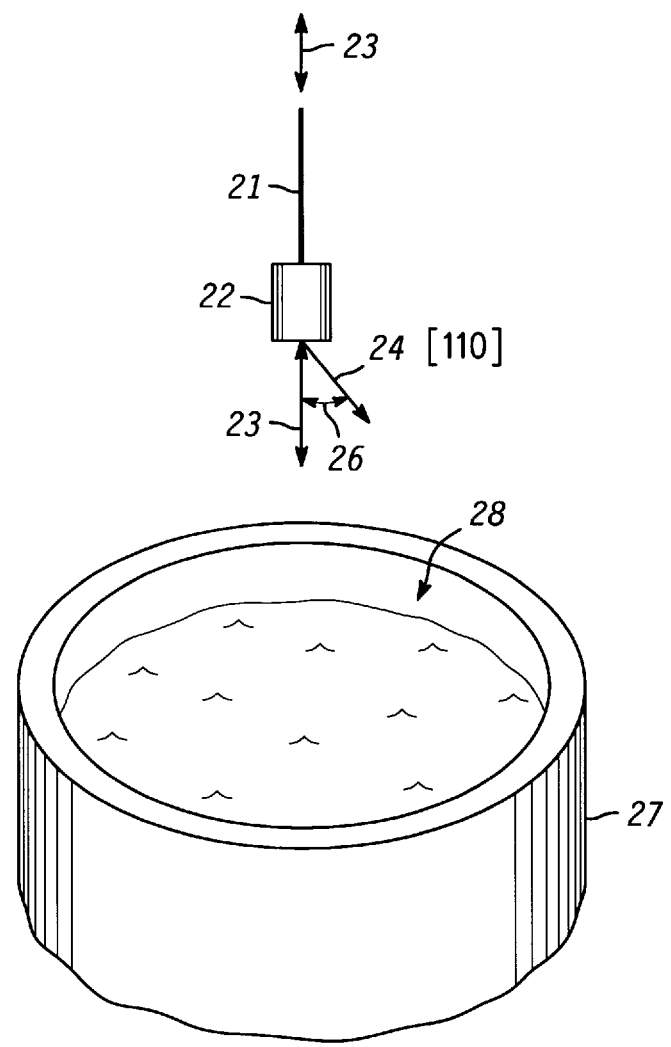
FIG. 2 schematically illustrates a stage in the growth of a [110] oriented semiconductor ingot in accordance with the present invention.

FIG. 2 schematically illustrates a step in the formation of a semiconductor ingot that is substantially free of dislocations. As used herein, substantially free of dislocations includes substantially free of dislocations that result from crystal growth; however, there may be other types of small dislocations such as small loop dislocations, or stacking faults, or partial dislocations that do not result from crystal growth. At the stage of formation shown in FIG. 2, a container or crucible 27 holds or contains a melt 28 of semiconductor material that is used for forming ingots of semiconductor material. Spaced above melt 28 is a pulling mechanism and seed holder 21 that is used for inserting a single crystal seed 22 of the semiconductor material within melt 28. Holder 21 also is used for withdrawing or pulling seed 22 from melt 28 in order to form a semiconductor ingot. Holder 21 is inserted into melt 28 and withdrawn or pulled from melt 28 along a pull direction 23, shown by an arrow. Seed 22 is formed to have a [110] direction 24 of the crystal lattice orientation exposed in the general direction of melt 28. As will be seen hereinafter, direction 24 is shifted an angle 26, shown by an arrow, from direction 23. Consequently, direction 24 is shifted angle 26 from a plane or a direction normal to the surface of melt 28. It should be noted that angle 26 is shown exaggerated for the purpose of illustration and explanation.

Subsequently, seed 22 is lowered along direction 23 and inserted into melt 28. Thereafter, seed 22 is pulled from melt 28 in order to grow an ingot of the material within melt 28. Typically, seed 22 is at a much lower temperature than melt 28. It is this temperature differential that generally causes faults or dislocations to occur in the ingot that results by pulling seed 22 from melt 28.

Figure 3:
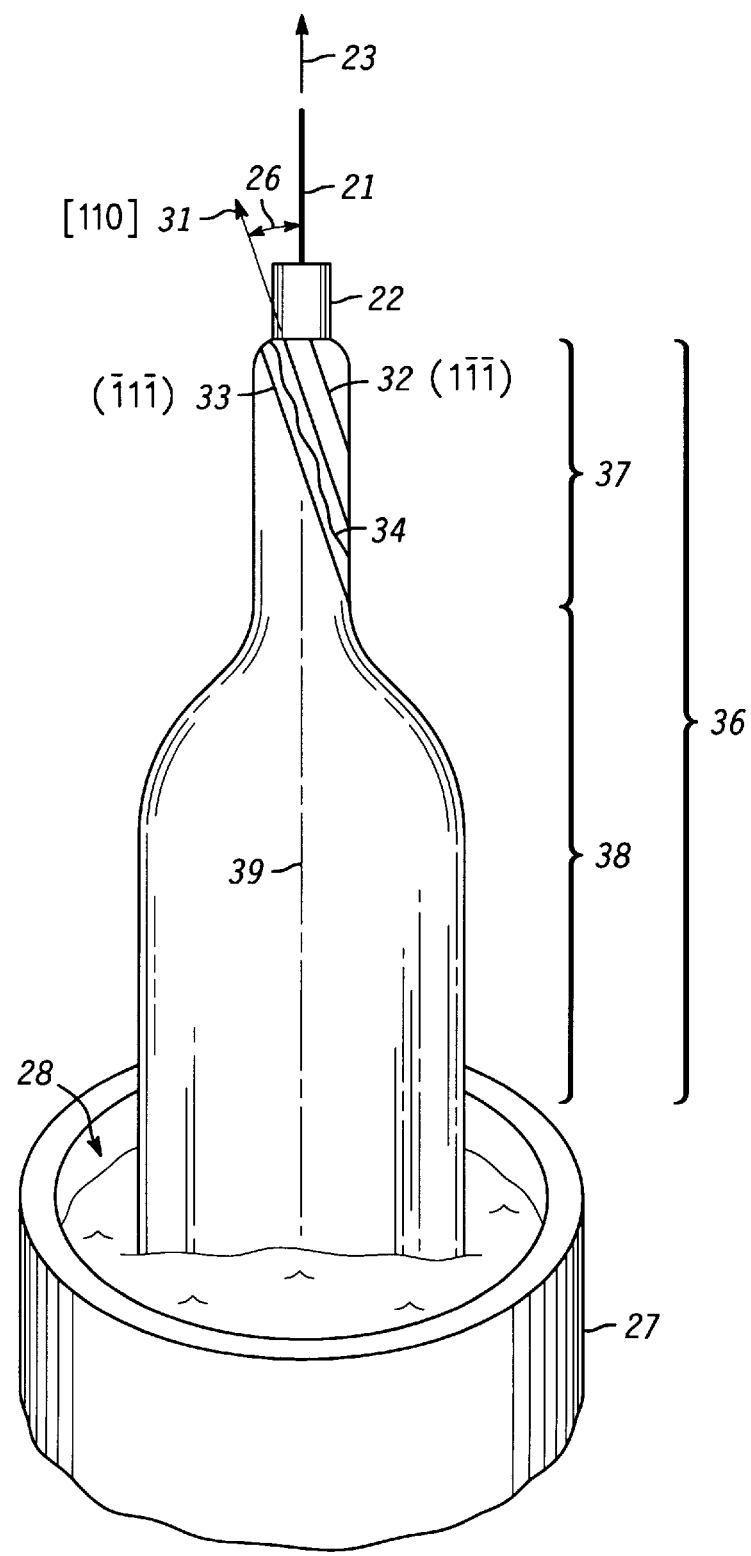
FIG. 3 schematically illustrates a subsequent stage in the growth of a [110] oriented semiconductor ingot in accordance with the present invention.

FIG. 3 schematically illustrates a subsequent stage in utilizing seed 22 to form a single crystal semiconductor ingot 36. Seed 22 is initially pulled from melt 28 along direction 23 at a first rate that is sufficiently fast to form a small diameter neck 37. Subsequently, seed 22 is withdrawn or pulled at a slower rate along direction 23 in order to form a larger diameter body 38 on ingot 36. Body 38 will be utilized for forming semiconductor wafers whereas neck 37 is formed in order to assist in substantially preventing dislocations within body 38. As indicated hereinbefore in the discussion of FIG. 2, seed 22 has a [110] direction 24 that is shifted angle 26 from direction 23. As a result, the crystalline lattice structure of ingot 36 is aligned to the crystal lattice orientation of seed 22 so that ingot 36 has a [110] direction 31 of the crystal lattice orientation that is shifted angle 26 from a stem axis or major axis 39 of ingot 36. As a result, ingot 36 has {111} planes 32 and 33 that run parallel to direction 31. Consequently, planes 32 and 33 are also shifted angle 26 from axis 39. Therefore, dislocations, such as a dislocation 34, do not run along the length of ingot 36. Instead, dislocation 34 extends at angle 26 to axis 39. Consequently, if neck 37 has a sufficient length, any dislocations that form in neck 37 will eventually terminate on the surface of neck 37 and will not propagate into body 38. As a result, ingot 36 will be formed substantially free of dislocations.

The relationship between the diameter of neck 37, the length of neck 37, and angle 26 are important in achieving ingot 36 being substantially free of dislocations. In the preferred embodiment, angle 26 is approximately two to five degrees, neck 37 has a diameter of approximately three millimeters to six millimeters, and neck 37 has a length between approximately fifty and one hundred fifty millimeters in order to form ingot 36 substantially free of dislocations. In the preferred embodiment, planes 32 and 33 are ($\bar{1}11$) and ($\bar{1}1\bar{1}$), respectively. As known to those skilled in the art, planes 32 and 33 could also be ($\bar{1}11$) and ($1\bar{1}1$), respectively.

It should be noted that the afore described method of forming substantially dislocation free ingots of semiconductor material can be used with either the Float Zone or Czochralski methods. Additionally, the method applies to silicon semiconductor material as well as other material having planes where dislocations propagate through the resulting ingot.

After formation, ingot 36 can be sawed or sliced at an angle that is substantially equal to angle 26 in order to obtain wafers having a [110] orientation that is substantially normal to surface of the wafer. Sawing at such an angle results in a slightly oblong or elongated wafer instead of a circular wafer. The edges of the wafer can be ground in order to reshape the wafer to a circular shape.

By now it should be apparent that there has been provided a novel method of forming semiconductor material. By using a seed having a [110] direction that is shifted from the pull axis and from the major axis of the resulting ingot, the resulting ingot also has a [110] direction that is shifted the first angle from the pull direction and from the axis of the ingot. Forming such a [110] direction results in terminating dislocations along the surface of the neck of the ingot so that the body of the ingot is substantially dislocation free. The equipment to grow such an ingot does not have to be modified, thus, the growth costs are low.

I claim:

1. A method of forming semiconductor material comprising:

forming an ingot of a semiconductor material from a melt of the semiconductor material wherein the ingot has a [110] direction of a crystal lattice orientation of the ingot and wherein the [110] direction is shifted an angle away from a direction parallel to a stem axis of the ingot.

2. The method of claim 1 wherein forming the ingot includes forming the angle less than 90 degrees.

3. The method of claim 2 wherein forming the ingot includes forming the angle between 2 and 5 degrees.

4. The method of claim 1 wherein forming the ingot of the semiconductor material from the melt includes forming the stem axis shifted the angle from a (111) plane of the crystal lattice orientation of the ingot.

5. The method of claim 1 further including forming the ingot with a neck having a first diameter and a body having a second diameter that is greater than the first diameter wherein the neck has a length so that the body is free from dislocations in a crystal lattice orientation of the ingot.

6. A semiconductor crystal growth method comprising the steps of:

providing a melt of a semiconductor material;

inserting a single crystal seed of the semiconductor material into the melt; and forming a single crystal ingot of the semiconductor material extending from the single crystal seed wherein the single crystal seed and the single crystal ingot have a [110] direction of a crystal lattice orientation of the single crystal seed and the single crystal ingot wherein the [110] direction is shifted an angle less than 90 degrees from a stem axis of the single crystal ingot.

7. The method of claim 6 wherein forming the single crystal ingot includes forming the angle between approximately 2 and 5 degrees.

8. The method of claim 6 wherein forming the single crystal ingot includes forming the stem axis shifted the angle from a (111) plane of the crystal lattice orientation of the single crystal ingot.

9. The method of claim 6 further including forming the single crystal ingot with a neck having a first diameter and a body having a second diameter that is greater than the first diameter wherein the neck has a length so that the body is free from dislocations in a (111) plane of the crystal lattice orientation of the single crystal ingot.

10. A method of growing [110] oriented semiconductor material comprising:

providing a melt of the semiconductor material, the melt having a surface;

inserting a single crystal seed of the semiconductor material into the melt, the single crystal seed having a [110] direction of a crystal lattice orientation of the single crystal seed wherein the [110] direction is shifted an angle from a plane normal to the surface of the melt; and pulling the single crystal seed from the melt to grow an ingot of the semiconductor material from the melt wherein a 110 direction of the ingot is the angle from a stem axis of the ingot.

11. The method of claim 10 wherein pulling the single crystal seed from the melt to grow the ingot includes pulling the single crystal seed at a first rate to form a neck, then pulling the single crystal seed at a second rate to form a body of the ingot that has a diameter that is larger than the neck.

12. The method of claim 11 wherein pulling the single crystal seed at the first rate includes forming the neck with a diameter between 3 and 6 mm and a length between approximately 50 to 150 mm.

13. The method of claim 10 wherein inserting the single crystal seed into the melt includes forming the angle between approximately 2 and 5 degrees.

14. The method of claim 10 further including sawing a wafer from the ingot wherein the ingot is sawed at the angle so that is normal to a surface of the wafer.

15. The method of claim 14 further including grinding the wafer to form a circular wafer.

* * * * *